(12) United States Patent
Smithers et al.

(10) Patent No.: US 6,725,412 B1
(45) Date of Patent: Apr. 20, 2004

(54) LOW LATENCY DATA ENCODER

(75) Inventors: Michael J. Smithers, San Francisco, CA (US); Michael M. Truman, San Francisco, CA (US); Stephen D. Vernon, San Francisco, CA (US); Kenneth J. Gundry, San Francisco, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 479 days.

(21) Appl. No.: 09/639,012

(22) Filed: Aug. 15, 2000

(51) Int. Cl.$^7$ .............................................. H03M 13/00
(52) U.S. Cl. ...................................................... 714/758
(58) Field of Search ........................................ 714/758

(56) References Cited

U.S. PATENT DOCUMENTS

| | | | |
|---|---|---|---|
| 6,192,501 B1 * | 2/2001 | Hladik et al. | 714/786 |
| 6,212,660 B1 * | 4/2001 | Joeressen et al. | 714/758 |
| 6,560,496 B1 | 5/2003 | Michener | 700/94 |
| 6,567,392 B1 * | 5/2003 | Rubin et al. | 370/342 |

FOREIGN PATENT DOCUMENTS

| | | |
|---|---|---|
| EP | 0156440 | 1/1985 |
| WO | WO 01/25105 | 6/2001 |

OTHER PUBLICATIONS

*Digital Audio Compression Standard* (Dolby AC–3), Document A/52, Advanced Television Systems Committee, Approved Nov. 10, 1994. (Rev 1) Annex A added Apr. 12, 1995. (Rev 2) 13 corrigenda added May 24, 1995. (Rev 3) Annex B and C added Dec. 20, 1995. available on the Internet at http://www.atsc.org/Standards/A52/.

Errata sheet for Document A/52, Jul. 22, 1999, Dolby Laboratories document S99/12496/12659, available on the Internet at http://www.dolby.com/tech/ATSC_err.pdf.

* cited by examiner

*Primary Examiner*—Albert Decady
*Assistant Examiner*—Cynthia Britt
(74) *Attorney, Agent, or Firm*—Gallagher & Lathrop; Thomas A. Gallagher

(57) ABSTRACT

Codeword-position-caused encoder latency is reduced by avoiding the requirement for knowledge of the message prior to generating an error detecting or concealing codeword associated with the message. A pseudo error detecting or concealing codeword is inserted in place of the normal error detecting or concealing codeword appropriate for the segment of information to which the error detecting or concealing codeword relates. In order to satisfy the requirement of conventional decoders, the pseudo error detecting or concealing information must match or be appropriate for the segment so that the decoder sees the codeword and message segment as valid or error free. This is accomplished by modifying or perturbing at least a portion of the segment to which the pseudo codeword relates. The invention is particularly useful for maintaining the backward compatibility of audio data encoding formats in which the minimum latency is too long (e.g., computer games, where the player performs some operation leading to a sound, and that sound must not be perceptibly delayed with respect to the operation).

14 Claims, 4 Drawing Sheets

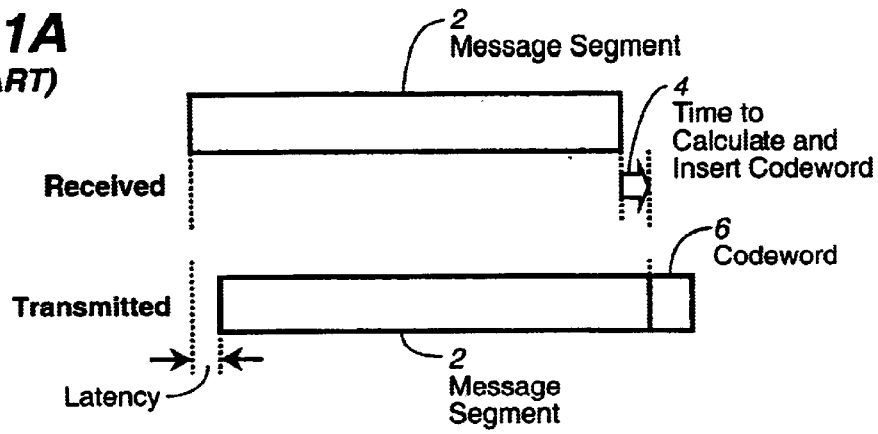
FIG._1A (PRIOR ART)
FIG._1B (PRIOR ART)
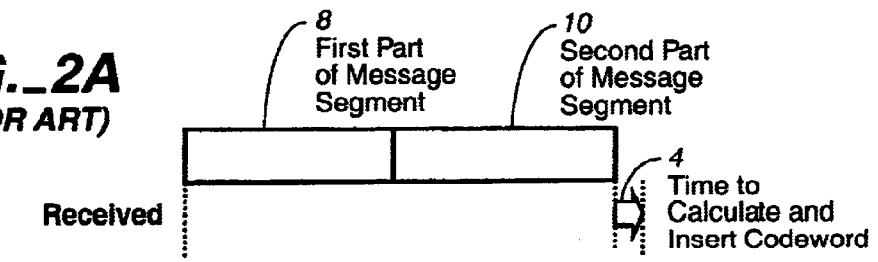
FIG._2A (PRIOR ART)
FIG._2B (PRIOR ART)

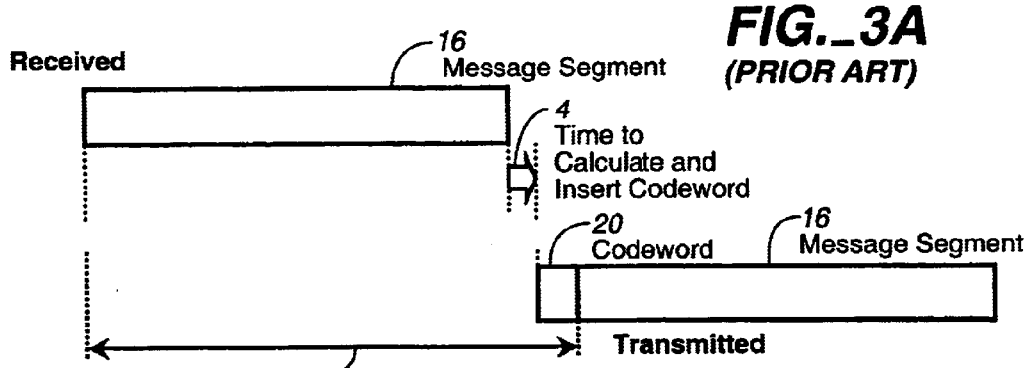
FIG._3A (PRIOR ART)
FIG._3B (PRIOR ART)
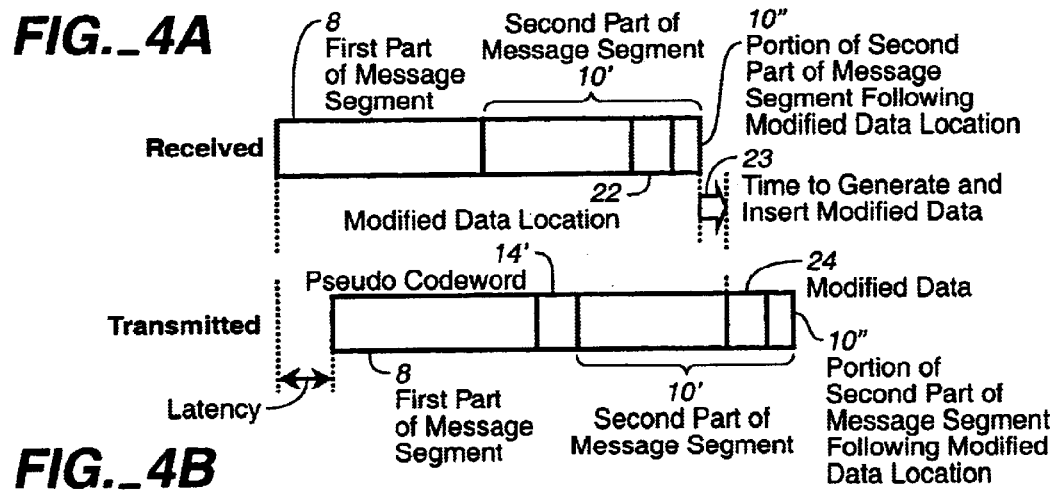
FIG._4A
FIG._4B
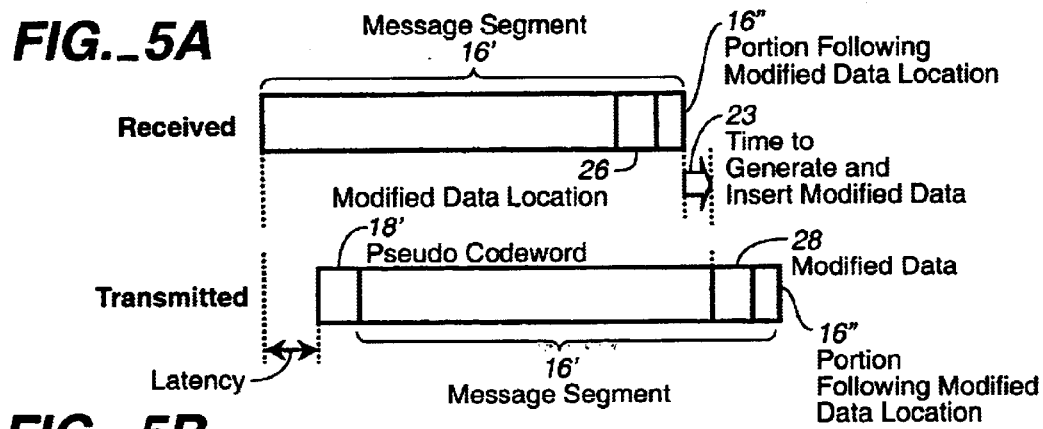
FIG._5A
FIG._5B

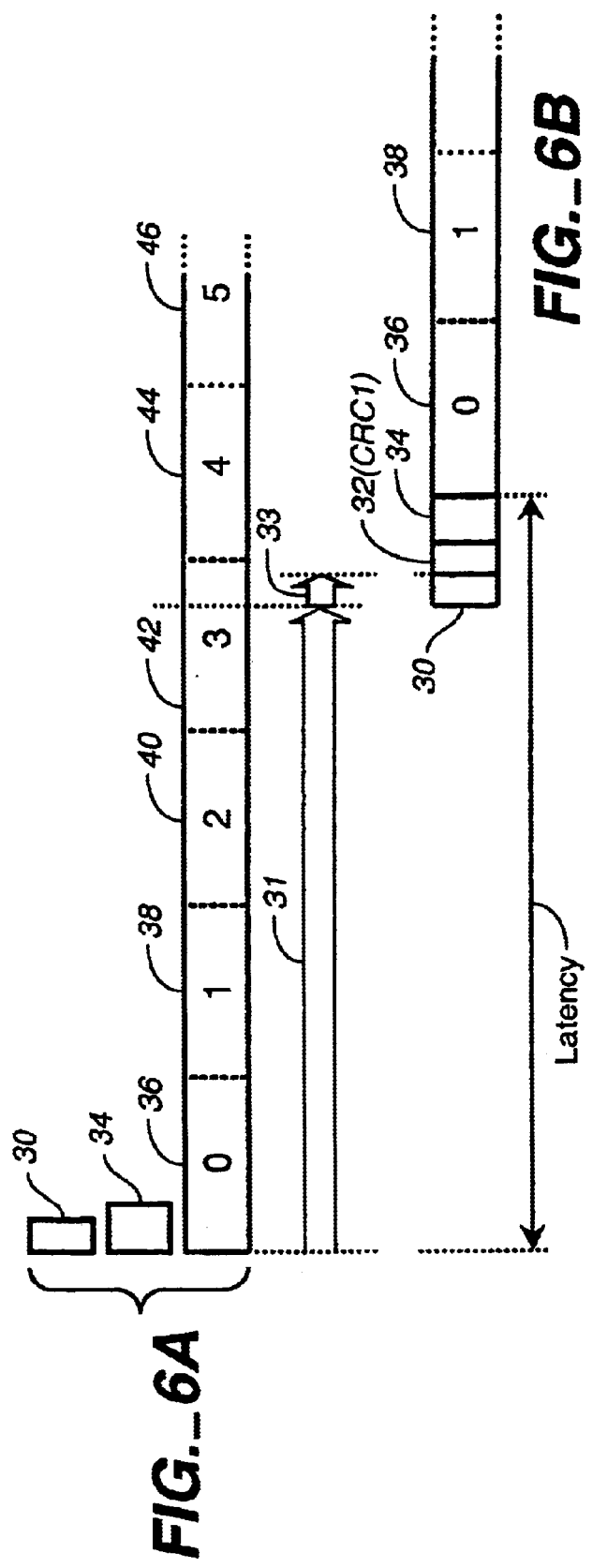

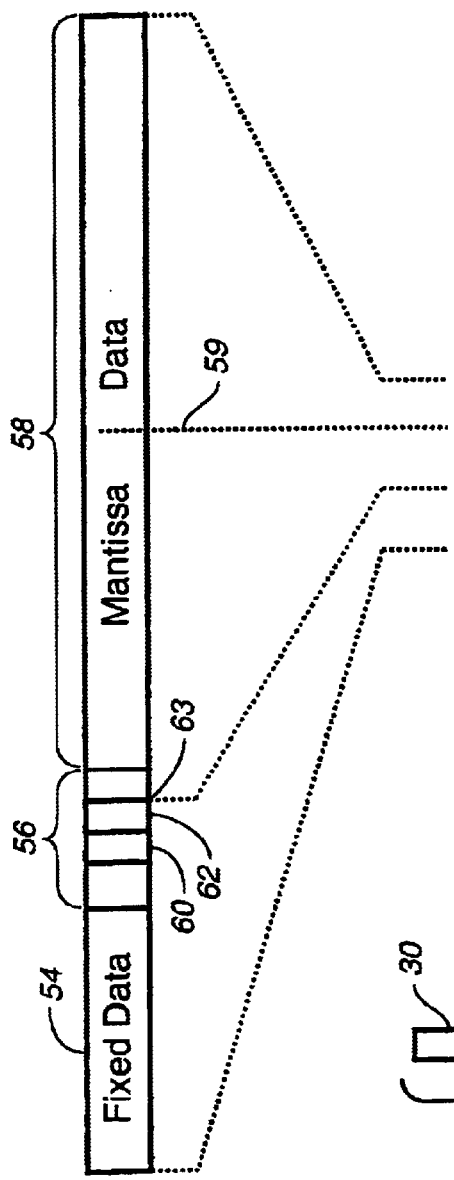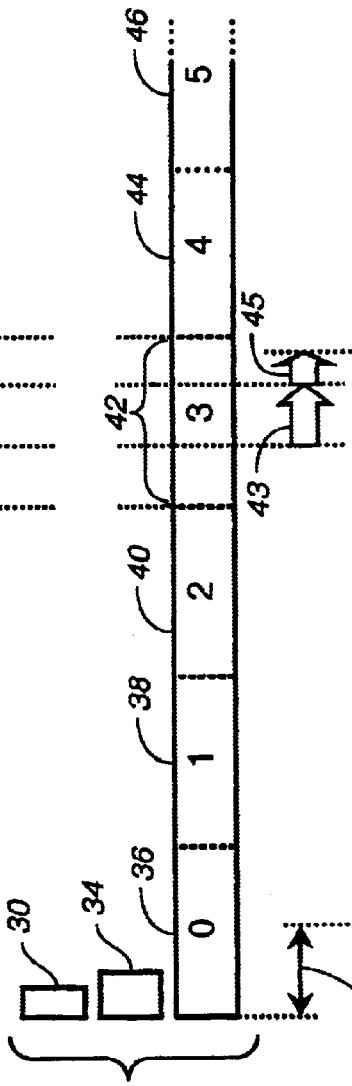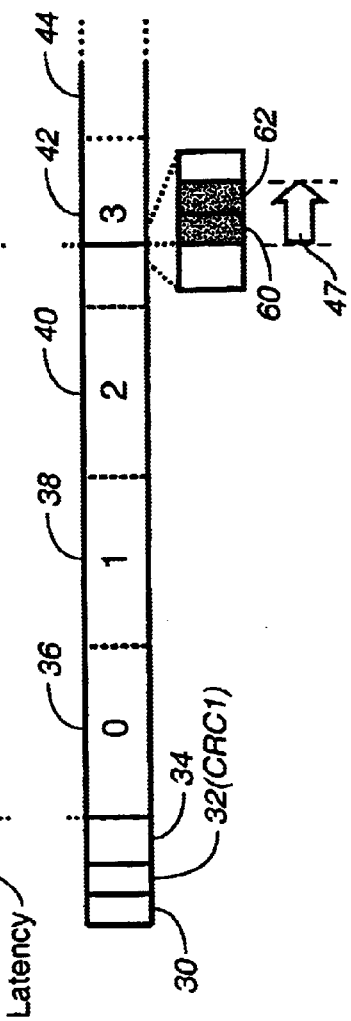
FIG._7A
FIG._7B
FIG._7C

LOW LATENCY DATA ENCODER

FIELD OF THE INVENTION

The invention relates to audio signal processing. In particular, the invention relates to the reduction of latency (i.e., time delay) in the digital encoding of audio information.

BACKGROUND OF THE INVENTION

Various methods of data transmission and storage require mechanisms to detect (or detect and conceal) errors. In order to do so, data is often partitioned into portions, packets, or segments such that for a given segment, appropriate error detection or concealment information is generated. This information, typically a codeword or parity word, may be associated with the segment in a known position by an encoding or transmission process. A decoding or receiving system uses the codeword and its associated segment at least to detect the presence of errors, and, possibly to conceal errors. In the prior art, generation of the codeword requires prior knowledge of the entire segment. Consequently, the latency, that is, the time delay, between the receipt of information included in the segment and the segment's transmission by an encoder or transmitter is a function of the position of the codeword in the transmitted segment. As explained below, latency resulting from codeword positioning in a data format is least when the codeword follows the other data; it is greatest when the codeword precedes the other data.

FIGS. 1–3 illustrate latency with respect to three examples of codeword positions. For simplicity of explanation of the effect of codeword position on latency in these and other figures throughout this document, the data applied to an encoder or transmitter along with any auxiliary data (including null or "stuffing" bits, if any) applied to or generated within the encoder or transmitter is shown already formatted into a block, frame or packet (in FIGS. 1–5, it is referred to as a "message segment"). It will be understood that such a block, frame, packet or message segment is, in practice, built incrementally as incoming information is received and that doing so involves other latency considerations that form no part of the present invention.

In FIG. 1B, a received message segment 2 is shown. FIG. 1A shows the transmitted data format in which the message segment 2 is followed by a codeword 6. Ignoring all latency considerations other than those arising from the codeword location, the minimum latency between the onset of reception of the information that becomes message segment 2 and the earliest time at which transmission may begin is at least the sum of: (1) the time required to calculate the codeword, (2) the time required to insert the codeword into its location in the data format (which usually is very short), and (3) the time to transmit the codeword (times 1 and 2 are represented by an arrow 4 in FIG. 1A). It is possible to begin transmission well prior to generating the codeword. This codeword position is optimum from a codeword-position-caused latency standpoint because the onset of transmission does not require knowledge of the entire message. As explained further below, the present invention cannot improve latency when a codeword follows a message segment, such as in this example. Indeed, it will be seen that the invention strives to achieve the effect of such an optimum codeword position in systems in which the codeword position is not optimum (but which must remain in such a position because of compatibility or other requirements).

In order to provide a sense of the relative latencies in FIG. 1 (and in the following FIGS. 2–5) between the received information and the transmitted information, latency is indicated as the time lapse between the schematic rendition of the formatted received information (FIG. 1A and FIGS. 2A, 3A, 4A, 5A, 6A, and 7B) and the schematic rendition of the transmitted information (FIG. 1B, and FIGS. 2B, 3B, 4B, SB, 6B, and 7C, respectively).

FIGS. 2 and 3 show codeword positions for which the codeword-position-caused latency can be reduced by the present invention.

In FIG. 2A, a format is shown in which a received message segment is divided into two received message segments 8 and 10. FIG. 2 is idealized, schematic and not to scale (likewise, other figures herein are idealized, schematic and not to scale). For transmission, as shown in FIG. 2B, at least one error detection or concealment codeword 14 appropriate to the message segments 8 and 10 is generated and inserted in a codeword location in between message segments 8 and 10. Thus, relative to its optimum position after the message segment as shown in FIG. 1, the codeword position is toward the beginning of the message segment in the FIG. 2 format. The codeword position 14 is intended to show any codeword position between the beginning and end of a message segment. Again, ignoring all latency considerations other than those arising from the codeword location, the minimum latency between the onset of reception of the information that becomes message segment 8 and the earliest time at which transmission may begin is the sum of: (1) the time to receive the information that becomes the second part 10 of the message segment (FIGS. 2A and 2B assume that this is the same as the time period of segment 10 in the assembled data format and in the transmission), (2) the time required to calculate the codeword, (3) the time required to insert the codeword into its location in the data and format (the arrow 12 in FIG. 2 represents times 2 and 3), and (4) the time to transmit the codeword. It is possible to transmit the message portion that appears before the codeword before the codeword is generated, but the codeword or codewords in location 14 cannot be transmitted until the entire message segment is known, thus causing an additional latency at least as great as the time to receive the information that is transmitted as the second message segment 10. Thus, although it is possible to begin transmission prior to generating the codeword, transmission cannot begin as early as in the optimum end-of-message codeword position of FIG. 1.

In FIG. 3A, a received message segment 16 is shown. For transmission, as shown in FIG. 3B, an error detection or concealment codeword 20 appropriate to the message segment 16 is generated and inserted in a codeword location preceding the message segment. Once again, ignoring all latency considerations other than those arising from the codeword location, the minimum latency between the onset of reception of the information that becomes message segment 16 and the earliest time at which transmission may begin is the sum of: (1) the time to receive all the information that is transmitted as the message segment 16 (FIGS. 3A and 3B assume that this is the same as the time period of segment 16 in the assembled data format and in the transmission), (2) the time required to calculate the codeword, (3) the time required to insert the codeword into its location (an arrow 18 in FIG. 3 represents times 2 and 3), and (4) the time required to transmit the codeword. FIG. 3 illustrates the worst case codeword position from the standpoint of encoder latency.

Thus, in all of the three codeword locations illustrated in FIGS. 1–3, the latency is at least the sum of:
- the time to calculate the codeword,
- the time to insert the codeword into its location,
- the time to transmit the codeword, and
- the time to receive the information that is transmitted as the message segment (if any) or portion of the message segment (if any) that follows the codeword position in the transmission.

The requirement in the prior art that the codeword cannot be generated and transmitted until the entire message is known does not cause a latency problem if the codeword follows the entire message segment. The further the codeword position is from the end of the transmission, the greater the encoder latency. Thus, from an encoder latency reduction standpoint, it is desirable to locate the codeword at the entire end of the message segment or as close thereto as possible. When designing a new system, it may be possible to optimize the codeword location for low encoder latency. However, in the case of existing systems that must remain compatible with existing decoders and receivers, it is not practical to change the codeword location. Such new or existing systems may have a disadvantageous codeword location from the standpoint of encoder latency (i.e., a location other than following the message segment). The codeword location may have been chosen to satisfy other considerations and/or encoder latency may not have been a concern when the system was designed. For some applications, it would be desirable to improve the codeword-position-caused latency of such systems while preserving the backward compatibility of such systems. It should be noted that, in principle, encoder latency has no affect on latency in the decoder—improving decoder latency is not a part of the present invention.

SUMMARY OF THE INVENTION

The present invention seeks to reduce codeword-position-caused latency by avoiding the requirement for knowledge of the message prior to generating the error detecting or concealing codeword. A pseudo error detecting or concealing codeword is inserted in place of the normal error detecting or concealing codeword appropriate for the segment of information to which the error detecting or concealing codeword relates. However, in order to satisfy a conventional decoder or receiver, the pseudo error detecting or concealing information must match or be appropriate for the segment so that the decoder sees the codeword and message segment as valid or error free. This is accomplished by modifying or perturbing at least a portion of the segment to which the pseudo codeword relates. Such modification or perturbation may be accomplished in various ways depending on the nature of the error detecting or concealing information. When its nature permits, the segment preferably remains unchanged except in a portion or portions at or near the end of the segment in order to optimize the reduction of the codeword-position-caused latency. The pseudo error detecting or concealing information may be arbitrary (for example, it may be a random number or a pseudo-random number) or, optionally, it may convey information. In either case, the same information may be used as pseudo error detecting or concealing information in connection with all or selected segments, or, alternatively, the information constituting the pseudo error detecting or concealing information may change from segment to segment.

If possible, the segment should be changed in a way that does not degrade the quality of the message segment when decoded (e.g., in the case of audio, it is desirable that the change is not audibly perceptible). Some portions of the message may be more tolerant to modification than others, and some message formats may have ancillary, auxiliary, or null-bit data fields that can be changed without affecting user perceptible data. Nevertheless, in some cases, there may be a tradeoff between quality degradation and latency reduction.

In other words, one is dealing with two pieces of information, a message X and a corresponding error detection or concealment codeword Y. Generally, one cannot calculate Y until one has all of X, so if one needs to send Y before X, one has a minimum latency of the duration of X. The present invention sidesteps this problem by inserting Y', a pseudo codeword instead of Y (in Y's location in the data format) and starts sending X before one has all of X, but during X (preferably towards the end of X), one modifies X to X' so that when one calculates its codeword in the receiver or decoder, it just happens to be Y'.

Thus, in one aspect, the invention contemplates a method for reducing latency in the transmission of coded information relative to received information, wherein the coded information includes at least an encoded version of the received information or a modified form of an encoded version of the received information along with error detecting or concealing information appropriate for the coded information. The coded information optionally includes auxiliary information that may include null bits. The coded information is transmitted in a format in which the error detecting or concealing information has an assigned position that does not follow all of the received information or modified form of the received information. Pseudo error detecting or concealing information is generated. The coded information with the pseudo error detecting or concealing information located in the assigned position or positions is generated in which an encoded version of the received information is modified and/or auxiliary information is modified and inserted so that the pseudo error detecting or concealing information is appropriate for the coded information. The coded information is transmitted, whereby the transmission of coded information may begin before all of the received information is received. The pseudo error detecting or concealing information may be in the form of at least one error correcting or concealing codeword. The codeword may be in the form of at least one error detecting cyclic redundancy check (CRC) word.

FIGS. 4 and 5 show how the codeword-position-latency of the disadvantageous codeword locations of FIGS. 2 and 3, respectively, may be improved in accordance with the present invention.

In FIG. 4A, a received message segment is divided into two received message segments 8 and 10'. Unlike FIG. 2, in accordance with an embodiment of the invention, a modified data location 22 preferably toward the end of the second segment 10' is provided in the transmitted format of FIG. 4B. Note that the second segment 10' includes the modified data location 22 and the portion 10" following the modified data location. The transmitted information, FIG. 4B, includes the first part of the message segment 8, followed by at least one pseudo codeword 14' in a codeword position and the remaining part of the message segment 10' that, in turn, includes modified data 24 in the modified data location. The modified data is chosen such that the pseudo codeword 14' becomes appropriate for the entire transmission (i.e., it is the same as the codeword that would normally be generated for a transmission that includes the modified data 24). Consequently, ignoring all encoder latency considerations other than those arising from the modified data location, the minimum latency between the onset of reception of the information that becomes message segment 8 and the earliest time at which transmission may commence is the sum of: (1) the time to receive the information that is subsequently sent as the part 10" of the message segment 10' that follows the modified data 24, (FIGS. 4A and 4B assume that this is the same as the time period of part 10" of message segment 10' in the assembled data format of FIG. 4A and in the transmission format of FIG. 4B), (2) the time required to generate the modified data, (3) the time to insert the modified data into its location (an arrow 23 represents times 2 and 3 in FIG. 4), and (4) the time to transmit the modified data 24.

Comparing FIG. 4 to FIG. 2 shows that a substantial reduction in encoder latency is possible, namely as much as the difference between the time to receive the information that becomes the second message segment 10' and the time to receive the information that becomes the message segment portion 10" that follows the modified data in the transmission. If the modified data location is at the end of the part of message segment 10' (i.e., there is no portion 10" following the modified data), the latency is substantially the same as that resulting from the optimum codeword positioning at the end of the transmission (FIG. 1). However, in some data formats it may not be possible or desirable to locate the modified data at the end of the message segment.

In accordance with an embodiment of the invention, in FIG. 5A, unlike FIG. 3, a received message segment 16' has a modified data location 26 toward the end of message segment 16'. As shown in FIG. 5B, the transmitted information includes a pseudo codeword 18' followed by the message segment 16' that includes modified data 28 in the modified data location. Note that the segment 16' is all of the information following codeword 18' including the modified data 28 in location 26 and the portion 16" following the modified data. As in the case of the FIG. 4 embodiment, the modified data is chosen such that the pseudo codeword 18' is appropriate for the entire transmission. Consequently, ignoring all latency considerations other than those arising from the modified data location, the minimum latency between the onset of reception of the information that becomes message segment 16' and the earliest time at which transmission may commence is, as in the case of the FIG. 4 embodiment, the sum of: (1) the time to receive the information that is subsequently sent as the part 16" of the message segment 16' that follows the modified data location (FIGS. 4A and 4B assume that this is the same as the time period of part 16" of the message segment 16' in the assembled data format of FIG. 5A and in the transmission format of FIG. 5B), (2) the time required to generate the modified data, (3) the time to insert the modified data into its location (an arrow 27 represents times 2 and 3), and (4) the time to transmit the modified data.

Comparing FIG. 5 to FIG. 3 shows that a substantial reduction in encoder latency is possible, namely, as much as the difference between the time to receive the information that becomes message segment 16' and the time to receive the information that becomes message segment 16" that follows the modified data position 26. If the modified data location is at the end of the part of message segment 16' (i.e., there is no portion 16" following the modified data), the latency is equivalent to that resulting from the optimum codeword positioning at the end of the transmission (FIG. 1). As noted above, in some data formats it may not be possible or desirable to locate the modified data at the end of the message segment.

BRIEF DESCRIPTION OF THE DRAWINGS

FIGS. 1–7 are idealized, schematic and not to scale.

FIGS. 1, 2, 3, and 6 illustrate the problem solved by the invention.

FIGS. 1–3 illustrate encoder latency with respect to three examples of codeword positions.

FIG. 1, shows a data format in which a received message segment has an assigned codeword location immediately following the message information. The position of FIG. 1A relative to FIG. 1B schematically illustrates the encoder latency for such a codeword location.

FIGS. 2 and 3 show codeword positions for which the codeword-position-caused latency can be reduced by the present invention.

FIG. 2, shows a data format in which a received message segment is divided into two received message segments, in between which an assigned codeword location is provided. The codeword position 12 is intended to show any codeword position between the beginning and end of a message segment. The position of FIG. 2A relative to FIG. 2B schematically illustrates the encoder latency for such a codeword location.

FIG. 3 shows a data format in which a received message segment has a codeword location preceding the message segment. The position of FIG. 3A relative to FIG. 3B schematically illustrates the encoder latency for such a codeword location.

FIGS. 4 and 5 show how the codeword-position-latency of the disadvantageous codeword locations of the examples of FIGS. 2 and 3, respectively, may be improved in accordance with the present invention.

In FIG. 4, a received message segment is divided into two received message segments in between which a codeword location is inserted for transmission. The position of FIG. 4A relative to FIG. 4B schematically illustrates the improved encoder latency in accordance with an embodiment of the invention.

In FIG. 5, a received message segment has a codeword location preceding the message segment. The position of FIG. 5A relative to FIG. 5B schematically illustrates the improved encoder latency in accordance with an embodiment of the invention.

FIG. 6 shows generally the format of a Dolby Digital frame and illustrates the latency problem. Dolby and Dolby Digital are trademarks of Dolby Laboratories Licensing Corporation.

FIG. 7 illustrates how the present invention may be applied to Dolby Digital encoding and decoding in order to reduce the latency explained in connection with FIG. 6. The position of FIG. 7C relative to FIG. 7B schematically illustrates the improved encoder latency in accordance with a preferred embodiment of the invention.

DETAILED DESCRIPTION OF THE PREFERRED EMBODIMENTS

Dolby Digital, a type of perceptual digital audio coding, creates a serial coded audio bit stream made up of a sequence of frames. FIG. 6A shows generally the format of a Dolby Digital frame and, with respect to FIG. 6B, illustrates the latency problem. Each transmitted Dolby Digital frame (FIG. 6B) is assembled from six coded audio blocks 0 through 5 (36, 38, 40, 42, 44, and 46), each of which represents 256 audio samples. A 16-bit sync word 30 sent at the beginning of each frame contains information needed to acquire and maintain synchronization. Each transmitted frame (FIG. 6B) contains two 16-bit cyclic redundancy check words, CRC1 (32) and CRC2 (not shown). CRC1 (32) is the second 16-bit word of the frame, immediately following the sync word 30. CRC2 (50) is the last (50)-bit word of the frame. CRC1 applies to the first ⅝ths of the frame, not including the sync word. CRC1 is reverse generated. Latency problems arise with respect to CRC1, as explained below. CRC2 applies to the entire frame, not including the sync word 30. CRC2 is forward generated. Decoding of the CRC words allows errors to be detected. A bit stream information header 34 follows the sync word and the CRC1 codeword and contains parameters describing the coded audio.

A boundary divides the frame into two message segments—a first ⅝ths of the frame and a remaining ⅜ths. The Dolby Digital frame is split into two message segments to improve decoder latency (so that the decoder can begin decoding the frame after it has received the first ⅝ths of the frame, rather than having to wait for the whole frame). CRC1 is placed at the beginning of the first message segment rather than at the ⅝ths boundary (i.e., after the first message segment) in order not to impose any additional frame boundary restrictions or constraints on the internal frame bit-stream structure. Further details of Dolby Digital are set forth in "Digital Audio Compression Standard (AC-3)," Advanced Television Systems Committee (ATSC), Document A/52, Dec. 20, 1995 (available on the World Wide Web of the Internet at www.atsc.org/Standards/A52/a_52.doc). See also the Errata Sheet of Jul. 22, 1999 (available on the World Wide Web of the Internet at www.dolby.com/tech/ATSC_err.pdf.

The following generator polynomial is used to generate each of the 16-bit CRC words in Dolby Digital: $x^{16}+x^{15}+x^2+1$. The CRC calculation may be implemented by one of several standard techniques. A convenient hardware implementation of the above polynomial is an arrangement of linear feedback shift registers (LFSRs). Checking for valid CRC with such a circuit consists of resetting all registers to zero, and then shifting the Dolby Digital data bits serially into the LFSR arrangement in the order in which they appear in the data stream. The sync word is not covered by either CRC (but is included in the ⅝ths frame size), so it is not included in the CRC calculation. CRC1 is considered valid if the register contains all zeros after the first ⅝ths of the frame has been shifted in. If the calculation is continued until all data in the frame has been shifted through, and the value is again equal to zero, then CRC2 is considered valid. CRC1 is generated by encoders such that the CRC calculation will produce zero at the ⅝ths point in the frame.

As schematically illustrated in the time-delayed position of FIG. 6B with respect to FIG. 6A, the position of the CRC1 codeword with respect to the first message segment of the Dolby Digital frame limits the minimum transmission latency of a Dolby Digital frame (excluding the initial syncword) to a time equal to the sum of: (1) the transmission time of the first message segment (excluding the initial syncword) (FIG. 6A assumes that this is the same as the time period represented by arrow 31), (2) the time to calculate CRC1, (3) the time to insert it in the frame (arrow 33 represents times 2 and 3), (4) the time to transmit CRC1, and (5) the time to transmit the bit stream information header 34. For the applications for which Dolby Digital was originally developed (e.g., DVD, digital television), this latency was acceptable. Indeed, video coding may show greater latency, so it may be necessary to delay the audio even further to put it in synchronism with the picture. However, for certain applications of Dolby Digital encoding, this minimum latency is too long (e.g., computer games, where the player performs some operation leading to a sound, and that sound must not be perceptibly delayed with respect to the operation). Very large numbers of existing decoders expecting the adopted format have already been sold and are in service. In order to remain compatible with such existing decoders, the Dolby Digital data format cannot be changed.

FIG. 7 illustrates how the present invention may be applied to Dolby Digital encoding and decoding in order to reduce the latency explained in connection with FIG. 6. FIGS. 7A and 7B show a modified frame structure. The time-delayed position of FIG. 7C relative to FIG. 7B schematically illustrates the improved encoder latency in accordance with this preferred embodiment of the invention. In accordance with the present invention, a pseudo codeword is inserted in the CRC1 codeword position and one of the six Dolby Digital blocks, the one straddling the ⅝ths frame boundary, is modified. This block is chosen in order to maximize the latency improvement by placing the modified data as close to the end of the message segment (the first ⅝ths of the frame) as possible. Preferably, two additional CRC codewords (the first is forward generated and the second is reverse generated), preferably adjacent to each other, are calculated and inserted into the message prior to the ⅝ths frame boundary. The first additional CRC codeword applies to the initial portion of the frame up to itself (excluding the sync word), while the second additional CRC codeword applies to the remaining portion of the frame from itself up to the ⅝ths frame boundary. When the first ⅝ths of the frame has been shifted into the linear feedback shift registers in a decoder, all of the registers will contain zeros and the pseudo CRC1 codeword will therefore appear valid to a standard Dolby Digital decoder. Thus, the minimum transmission latency is reduced from nominally the sum of: (1) the time to transmit ⅝ths of a frame, (2) the time to calculate CRC1, (3) the time to place it in the frame, (4) the time to transmit it, and (5) the time to transmit the bit stream information header, to nominally the sum of (1) the time to transmit the part of the frame between the second additional codeword and the ⅝ths frame boundary (indicated by arrow 43), (2) the time to calculate the additional codewords (it is assumed that no time is required to calculate and insert the pseudo CRC1 codeword), (3) the time to insert them in the block (arrow 45 indicates times 2 and 3), and (4) the time to transmit them (indicated by arrow 47). Note that the beginning of the transmission in FIG. 7C is shown at an earlier time than beginning of FIG. 7B because the sync word 30 is already known and generated. It will also be appreciated that the latency in FIG. 6 includes the bit stream information header 34 because it depends on the CRC1 codeword, whereas in FIG. 7, the latency does not include bit stream information header 34 because it does not depend on the pseudo CRC1 codeword.

This reduction in encoding latency, for example, facilitates real-time encoding on gaming platforms that have SPDIF outputs. A game generates a multi-channel sound field based on player input and the current state of the game. This sound field is then Dolby Digital encoded and transmitted in a SPDIF bit-stream to a Dolby Digital decoder or a Dolby Digital equipped receiver. The reduction in combined encoding/decoding latency achieved by the invention is such that the time delay between an action initiating a sound and that sound being heard is significantly reduced and, hence, less perceptible.

Returning to FIG. 7, the fourth Dolby Digital data block 42 (block 3), like each of the other five blocks in a Dolby Digital frame, has an initial fixed data portion 54, a skip field portion 56 and mantissa data 58. The skip field has a minimum size of one bit—if the bit is a 0, the skip field is only that one bit; if the bit is a 1, then the first bit is followed by a 9-bit code that indicates the number of dummy bytes (up to $2^9$ or 512) that the decoder should ignore when it decodes the audio after synchronization and error detection. Because it is supposed to be ignored by the decoder for purposes of audio decoding, but is included in the error detection process by the decoder (i.e., any bits present in the skip field are part of the bit stream applied to the linear feedback shift register in looking for all registers to contain zeros), the skip field is an ideal place to embed one or more additional CRC codewords.

One less desirable alternative is to embed one forward generated CRC codeword at the end of the message segment just before the ⅝ths frame boundary 59 by overwriting some of the mantissa data 58. Doing so may audibly affect the decoded audio to some degree.

Block 3(42), which straddles the ⅝ths frame boundary 59 is the only block in each frame that is altered. Preferably, it is modified by inserting a 16-bit forwarded generated CRC codeword 60 followed by a 16-bit CRC reverse-generated codeword 62 in the skip field 56. In order to assure that these CRC codewords are as close as possible to the ⅝ths frame boundary, additional constraints are placed on the encoded Dolby Digital bit stream: block 3 must straddle the ⅝ths frame boundary and the skip field location 56 must precede the ⅝ths frame boundary. The two CRC codewords 60 and 62 should be located so that the end of the second CRC codeword is on a word boundary 63 in order to make their calculation easier.

The skip field 56 is typically used only for padding purposes in order to satisfy certain bit stream and format constraints. However, some users of Dolby Digital carry information in the skip field. In such formats, the CRC codewords 60 and 62 should be inserted after such other information bits.

As mentioned above, for simplicity of explanation of the effect of codeword position on latency, the data applied to the Dolby Digital encoder including the two additional CRC codewords in the skip field are shown already formatted into a frame. It will be understood that such a frame is, in practice, built incrementally as incoming information is received and that doing so involves other latency considerations that form no part of the present invention.

Although the preferred embodiment employs cyclic redundancy coding, it will be understood that the invention is not limited to coding systems using CRC codes but is applicable to other types of linear block codes and to other types of error detection and concealment coding.

We claim:

1. A method for reducing latency in the transmission of coded information relative to received information, wherein
   the coded information includes error detecting or concealing information valid for said coded information,
   the coded information further includes an encoded version of said received information or a modified form of an encoded version of said received information,
   the coded information optionally includes auxiliary information that may include null bits, and
   wherein the coded information is transmitted in a format in which at least some of the error detecting or concealing information has an assigned position or positions that do not follow all of said encoded version of the received information or said modified form of said encoded version of the received information,
   comprising generating said coded information, which coded information includes pseudo error detecting or concealing information that is not valid for said encoded version of said received information or for said encoded version of said received information and said optional auxiliary information, wherein said generating includes at least one of
   a) modifying an encoded version of said received information in a manner that affects the validity of the error detecting or concealing information, and
   b) modifying said auxiliary information in a manner that affects the validity of the error detecting or concealing information,
   so that said pseudo error detecting or concealing information is valid for said coded information, and
   transmitting said coded information, whereby the transmission of coded information may begin before all of said received information is received.

2. A method according to claim 1 wherein said pseudo error detecting or concealing information is in the form of at least one error correcting or concealing codeword.

3. A method according to claim 2 wherein said codeword is in the form of at least one error detecting cyclic redundancy check (CRC) word.

4. A method according to any one of claims 1, 2, or 3 wherein said error detecting or concealing information has an assigned position preceding an encoded version of said received information or a modified form of an encoded version of said received information.

5. A method according to any one of claims 1, 2, or 3 wherein said error detecting or concealing information has an assigned position between the beginning and end of an encoded version of said received information or a modified form of an encoded version of said received information.

6. A method according to claim 1 wherein said pseudo error detecting or concealing information is arbitrary.

7. A method according to claim 6 wherein said pseudo error detecting or concealing information is a random number or a pseudo-random number.

8. A method according to claim 1 wherein said pseudo error detecting or concealing information conveys information.

9. A method for reducing latency in the transmission of coded information relative to received information, wherein the coded information is formatted into a frame that includes an encoded version of said received information or a modified form of an encoded version of said received information and a cyclic redundancy check (CRC) word having an assigned position preceding the encoded version of the received information or a modified form of the encoded version of the received information and that is valid for coded information in a first portion of the frame, comprising
   generating said coded information, which coded information includes at least one pseudo CRC word in the position of and in place of said CRC word, said pseudo CRC word not being valid for the coded information in said first portion of the frame, wherein said generating generates the coded information in the first portion of the frame after said pseudo CRC word so that the pseudo CRC word is valid for the first portion of the frame, and transmitting said coded information, whereby the transmission of coded information may begin before all of said received information is received.

10. A method according to claim 9 wherein two additional CRC words are generated and inserted in the first portion of the frame and after said pseudo CRC word.

11. A method according to claim 10 wherein the additional CRC word occurring first in the frame is a forward generated CRC word and the additional CRC word occurring second in the frame is a reverse generated CRC word.

12. A method according to claim 9 or claim 10 wherein said at least one additional CRC word is carried in auxiliary information.

13. A method according to claim 9 wherein said pseudo CRC word is a random number or a pseudo-random number.

14. A method according to claim 9 wherein said pseudo CRC word conveys information.

* * * * *